US012670966B2

(12) United States Patent
     Zlotnik

(10) Patent No.: US 12,670,966 B2
(45) Date of Patent: Jun. 30, 2026

(54) DEVICE DATA PATH MONITOR

(71) Applicant: Micron Technology, Inc., Boise, ID (US)

(72) Inventor: Leon Zlotnik, Camino, CA (US)

(73) Assignee: Micron Technology, Inc., Boise, ID (US)

( * ) Notice: Subject to any disclaimer, the term of this patent is extended or adjusted under 35 U.S.C. 154(b) by 4 days.

(21) Appl. No.: 18/830,204

(22) Filed: Sep. 10, 2024

(65) Prior Publication Data

US 2025/0259692 A1     Aug. 14, 2025

Related U.S. Application Data

(60) Provisional application No. 63/551,691, filed on Feb. 9, 2024.

(51) Int. Cl.
     *G11C 29/22*          (2006.01)
(52) U.S. Cl.
     CPC .................................... *G11C 29/22* (2013.01)
(58) Field of Classification Search
     None
     See application file for complete search history.

(56) References Cited

U.S. PATENT DOCUMENTS 9,569,305 B2 * 2/2017 Mukai .................... G11C 11/419
11,429,481 B1 * 8/2022 Azad ........................ G06F 12/06

2013/0151930 A1 * 6/2013 Yigzaw ............... G06F 11/2236
                                                        714/768
2018/0182446 A1 * 6/2018 Kondo .................... G11C 29/52
2018/0239530 A1 * 8/2018 Jalan ..................... G11C 11/419
2019/0139590 A1 * 5/2019 Berger .................. G06F 11/073
2020/0042451 A1 * 2/2020 Karmakar ............. G06F 12/121
2020/0043540 A1 * 2/2020 Berger ................ G06F 12/0895
2021/0089455 A1 * 3/2021 Berger .................. G11C 5/144
2021/0200470 A1 * 7/2021 Chan ..................... G06F 3/0656

OTHER PUBLICATIONS

N. E. Alias, S. Ishaak, K. J. Hong, M. L. P. Tan, A. Hamzah and Y. A. Wahab, "ASIC Implementation and Optimization of 16 Bit SDRAM Memory Controller," 2020 IEEE International Conference on Semiconductor Electronics (ICSE), Kuala Lumpur, Malaysia, 2020, pp. 81-84, (Year: 2020).*
Zlotnik, U.S. Appl. No. 18/787,812, filed Jul. 29, 2024.
Zlotnik, U.S. Appl. No. 63/568,329, filed Mar. 21, 2024.

* cited by examiner

*Primary Examiner* — Daniel F. McMahon
(74) *Attorney, Agent, or Firm* — Brooks, Cameron & Huebsch, PLLC

(57)          ABSTRACT

A processor determines whether a device is in an inactive state and, responsive to determining that the device is in the inactive state, accesses a number of addresses of the device. The processor monitors output data generated by the device responsive to the number of addresses to determine whether accessing one or more of the number of addresses results in an error. The output data is provided by the device along a path. The output data is continuously monitored when the device is in the inactive state. The processor performs an action responsive to determining that there is an error of the device.

20 Claims, 4 Drawing Sheets

DEVICE DATA PATH MONITOR

PRIORITY INFORMATION

This Application claims the benefit of U.S. Provisional Application No. 63/551,691, filed on Feb. 9, 2024, the contents of which are incorporated herein by reference.

TECHNICAL FIELD

Embodiments of the disclosure relate generally to a device data path monitor, and more specifically, relate to monitoring a device data path such as a read path.

BACKGROUND

Various types of electronic devices such as digital logic circuits and memory systems may store and process data. A digital logic circuit is an electronic circuit that processes digital signals or binary information, which can take on two possible values (usually represented as 0 and 1). The digital logic circuit can use logic gates to manipulate and transform the digital signals or binary information. Digital logic circuits can be, for example, used in a wide range of electronic devices including computers, calculators, digital clocks, and many other electronic devices that employ digital processing. Digital logic circuits can be designed to perform specific logical operations on digital inputs to generate digital outputs, and, in some instances, can be combined to form more complex circuits to perform more complex operations. A memory device can include one or more memory devices that store data. The memory devices can be, for example, non-volatile memory devices and volatile memory devices. In general, a host system can utilize a memory system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
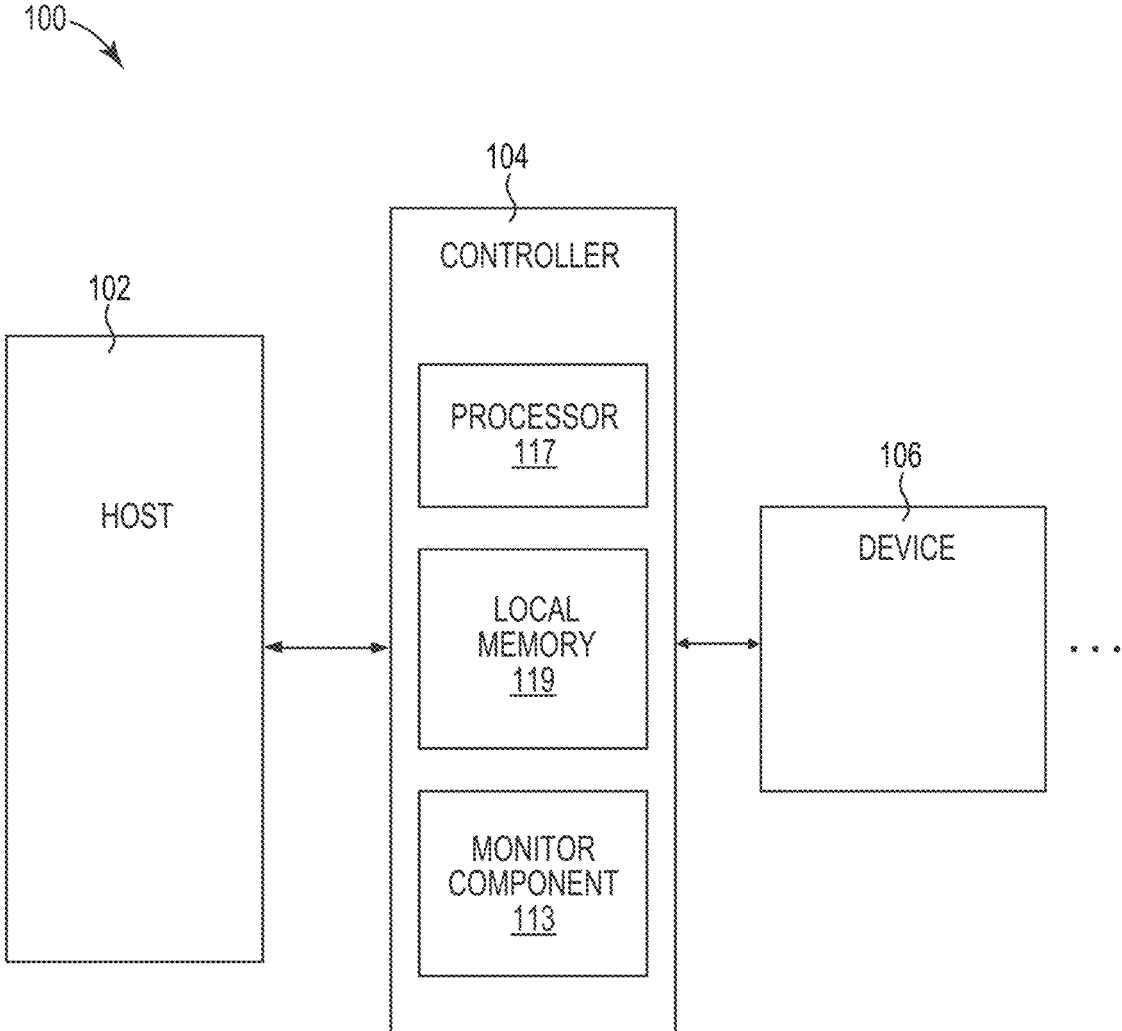
FIG. 1 illustrates an example electronic system that includes a host, a controller, and a device in accordance with various embodiments of the present disclosure.

Aspects of the present disclosure are directed to a device data path monitor. A monitor can be coupled to the device and can provide input data to the device via a device data path and can monitor output data via the device data path. For example, the monitor can determine whether the device is inactive. Responsive to determining that the device is inactive, the monitor can provide an address to the device. The monitor can monitor output data generated by the device responsive to receipt of the address. The monitor can monitor the output data to determine whether there is an error associated with the device. The command can be provided to the device along the device data path. The output data can be provided by the device along the device data path. The monitor can perform an action responsive to determining that there is an error associated with the device. The device can be an addressable device.

Although some non-limiting examples herein are generally described in terms of applicability to memory systems and/or to memory devices, embodiments are not so limited, and aspects of the present disclosure can be applied as well to a system-on-a-chip, computing sub-system, data collection and processing, storage, networking, communication, power, artificial intelligence, control, telemetry, sensing and monitoring, digital entertainment and other types of systems/sub-systems and/or devices. Accordingly, aspects of the present disclosure can be applied to these components in order to monitor a device data path, as described herein. As used herein, a device data path can be a path along which the device receives data and/or provides data. For example, the device data path can include an input path and/or an output path.

The device path functionality can become compromised. For example, the device data path can experience security threats. The device data path can experience timing issues. The device data path can experience safety issues. The device data path can experience aging issues. These issues can affect the user experience of the device.

In order to address these and other deficiencies of current approaches, embodiments of the present disclosure allow the device data path to be monitored to identify said issues. The monitor can comprise hardware and/or firmware. The monitor can, for example, continuously or periodically provide addresses to the device utilizing an input path. As used herein, continuously providing addresses can include providing addresses repetitively over a period of time, for example, by toggling among a plurality of different addresses. Periodically providing addresses can include providing address repetitively over a period of time and not providing addresses over a different period of time. The monitor can intercept output data provided by the device utilizing an output path. The monitor can analyze attributes of the output data to determine whether there are particular issues with the output data. The issues may be identified without waiting for commands from an external source because the monitor continuously provides commands. Although the examples described herein are provided in the context of a monitor, the examples can be implemented by a processing device that can include circuitry to implement the functionality of the monitor as described. The processor can include hardware, software, and/or firmware.

FIG. 1 illustrates an example electronic system 100 that includes a host 102, a controller 104, and a device 106 in accordance with various embodiments of the present disclosure.

The electronic system 100 can be, or can be part of, for example, a desktop computer, laptop computer, televisions, home theater system, gaming console, digital camera, network router and/or switch, printer, scanner, medical device, GPS navigation device, home device (e.g., thermostat, doorbell camera, security camera, smart lock, etc.), wearable device, industrial control system (e.g., automated industrial and/or control device) mobile computing device, a vehicle (e.g., airplane, drone, train, automobile, or other conveyance), Internet of Things (IoT) enabled device, embedded computer (e.g., one included in a vehicle, industrial equipment, or a networked commercial device), system-on-chip (SoC), chipset (e.g., a collection of integrated circuits), tile, Field-Programmable Gate Array (FPGA) structure (e.g., segmented FPGA structure), or other such device.

The electronic system 100 can be, or can include, a computing fabric. As used herein, the term "computing fabric" generally refers to a conveying, multiplexing, network, computing, or communication topology in which components pass data to each other through interconnecting switches, hubs, routers, multiplexers, buses, transmission lines and rings, cables, optical couplers and fibers, electromagnetic devices, or various other means. For example, a "computing fabric" can include various components (e.g., interconnects, crossbars, networks on chip, token rings, etc.) within a computing, memory, data storage and/or processing, network and/or telecommunication, artificial intelligence, control and/or telemetry, digital entertainment and/or other system, that facilitates in-chip and/or inter-chip communication.

The electronic system 100 includes a host 102. The host 102 can include a processor chipset and a software stack executed by the processor chipset. For example, the host 102 can be, or can include, a central processing unit (CPU) or a CPU complex that can be configured to execute an operating system.

The host 102 can be coupled to the controller 104 via a physical and/or logical host interface that operates based on various communication protocols and to provide control, address, data, and other signals to the controller 104 (e.g., to further cause the controller 104 to control the device 106). Examples of the interface between the host 102 and the controller 104 can include, but not limited to, a bus interface (e.g., a serial advanced technology attachment (SATA) interface, a Serial Attached SCSI (SAS) interface, a Serial Attached SCSI (SAS) interface, a Small Computer System Interface (SCSI), a peripheral component interconnect express (PCIe) interface, ISA, etc.), a memory interface (e.g., a double data rate (DDR) interface, a dual in-line memory module (DIMM) interface, an Open NAND Flash Interface (ONFI) interface, an NVM Express (NVMe) interface), a Fibre Channel, an UART interface, an I2C interface, a Serial Peripheral Interface (SPI), an Universal Serial Bus (USB) interface, an ethernet interface, a general-purpose input/output (GIPO) interface, a custom interface, etc.

The controller 104 is communicatively coupled to one or more electronic devices 106 such that signaling can be exchanged therebetween. Non-limiting examples of the devices 106 can include microcontrollers, microprocessors, digital logic circuits, analog circuits, light emitting diodes (LEDs), displays, sensors, motors, actuators, audio amplifiers, radio frequency (RF) circuits, test and measurement instruments (e.g., oscilloscopes, multimeters, etc.), automotive electronics, medical devices, telecommunication equipment, memory devices (e.g., volatile and/or non-volatile memory devices), graphics processing units, processors/co-processors, logic blocks, intellectual property (IP) cores, etc. As used herein, a "core" or "IP core" generally refers to one or more blocks of data and/or logic that form constituent components of an application-specific integrated circuit or field-programmable gate array. The circuit portion areas can be designed, built, and/or otherwise configured to perform specific tasks and/or functions within the systems described herein.

As shown in FIG. 1, the controller 104 can include a processing device (e.g., processor 117) that can execute instructions stored in a local memory 119 to perform various operations described herein. The controller 104 can include various special purpose circuitry in the form of an ASIC, FPGA, state machine, and/or other logic circuitry that can perform operations described herein. As an example, the controller 104 can be a memory controller.

In various embodiments, one or more constituent components (e.g., host 102, controller 104, device 106, etc.) of system 100 can be part of a SoC. In one example, a device 106 itself can correspond to an SoC, while the host 102 and the controller 104 are considered "external" to the SoC. In another example, the host 102 or the controller 104, or both, can be considered as a part of an SoC along with the device 106 being internal or external to the SoC.

As shown in FIG. 1, the controller 104 can include a monitor component 113. The monitor component 113 can be resident on the controller 104. As used herein, the term "resident on" refers to something that is physically located on a particular component. For example, the monitor component 113 being "resident on" the controller 104, for example, refers to a condition in which the hardware circuitry that comprises the monitor component 113 is physically located on the controller 104. The term "resident on" may be used interchangeably with other terms such as "deployed on" or "located on," herein. In some embodiments, the voltage regulation component 113 is part of the host 102, an application, or an operating system.

Although not shown in FIG. 1 so as to not obfuscate the drawings, the monitor component 113 can include various circuitry to facilitate aspects of the disclosure described herein. For example, the monitor component 113 can include various circuitry to facilitate the monitoring of a device data path. Although not illustrated in FIG. 1, the monitor component 113 can be implemented external to the controller 104. For example, the monitor component 113 can be implemented external to the controller and can be coupled to the device 106. The device 106 can be implemented as the device 224 described in FIG. 2 but can be other types of devices as described.

Figure 2:
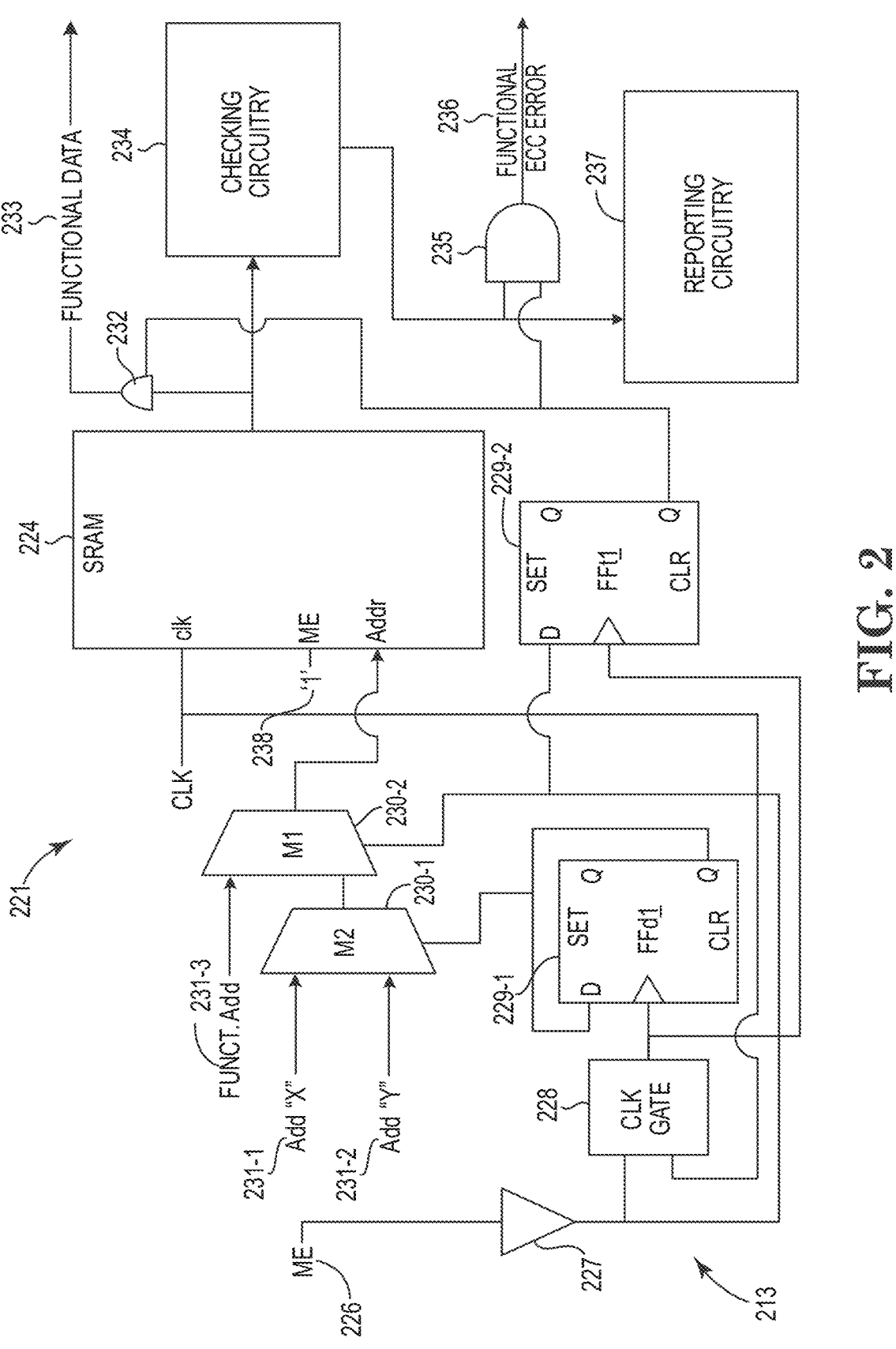
FIG. 2 illustrates an example system that includes a monitor component in accordance with some embodiments of the present disclosure.

FIG. 2 illustrates an example system 221 that includes a monitor component 213 in accordance with some embodiments of the present disclosure. The system 221 can be, for example, a memory system that can include a device 224. The device 224 can be, for example, a memory device. The system 221 can also include checking circuitry 234 and reporting circuitry 237. The monitor component 213 can also be referred to as a monitor 213. As used herein, the monitor 213 includes hardware configured to monitor a data path and/or timing path of a device. For example, the monitor 213 can monitor a memory read data path of the device 224. The read data path can be referred to as a read path or a data path. Although the device 224 is shown as static random access memory (SRAM), the device 224 can be implemented as other types of memory or other types of devices. For example, the device 224 can be a system-on-a-chip, computing sub-system, a data collection and processing device, a networking device, a communication device, power device, an accelerator (e.g., artificial intelligence accelerator), a control device, a telemetry device, a sensing and monitoring device, a digital entertainment device, an interface, and/or a fabric, among other types of devices. The device 224 can be an addressable device.

The monitor 213 can include a NOT gate 227, a clock gate 228, and sequential elements 229-1, 229-2. The sequential elements 229-1, 229-2 can be flip flops. The monitor 213 can also include multiplexors (MUXs) 230-1, 230-2. In various instances, the monitor can also include an AND gate 235 among other components of the monitor 213. The circuitry described herein is exemplary. The examples described herein can also be implemented using other circuitry.

The read path can include the signal line which provides the memory enable (ME) signal 226 to the device 224. Traditionally the ME signal 226 is used to enable or disable the device 224. Given that the ME signal 226 is not provided to the device 224, the ME pin 238 can remain high (e.g., can receive a "1" bit). The ME pin 238 can continuously receive a high signal "1" causing the device 224 to be read when the host is not providing commands to the device 224 (e.g., when the device 224 is idle). The ME pin 238 can remain high when the ME signal 226 is low so that the device 224 can be read when the ME signal 226 is low. Although the example of FIG. 2 shows the ME pin 238 as continuously remaining high, the ME pin 238 can periodically remain high to conserve power. For example, the ME pin 238 can change between remaining high and low for predefined periods of time. Although the ME signal 226 is used to determine whether the device 224 is idle, other signals and/or means can be utilized to determine whether the device is idle.

Traditionally, the ME signal 226 is provided to ME pin 238 of the device 224. In a number of examples, the ME pin 238 of the device 224 is biased "high" so that even when the ME signal 226 is low the device 224 can be read. In the example of FIG. 2, the ME signal 226 is used to enable/disable the monitor 213 whenever the ME signal 226 goes "low", which traditionally puts the device 224 in "idle" state. In a number of examples, the ME signal 226 can be used to enable the monitor 213 to allow for a reading of a toggled address to monitor the device 224.

The ME signal 226 can be used to determine whether the device 224 is idle. For example, if the ME signal 226 has a 1-value, then the device 224 can be active. If the ME signal 226 has a 0-value, then the device 224 can be inactive. Although the determination of idleness is described herein using the ME signal 226, the device 224 can be determined to be idle utilizing multiple signals. For example, the device 224 can be determined to be idle utilizing the ME signal and one or more additional signals. The device 224 can be determined to be idle utilizing different methods than those described herein. In various instances, the device 224 can be monitored if the device 224 is inactive. For example, the monitor 213 can be activated if the ME signal 226 has a 0-value. The read path which the monitor 213 monitors can also include the signal lines which provide data and/or address to the device 224. The read path can also include the signal lines which provide output data from the device 224. Although the example of FIG. 2 is provided in the context of monitoring a read path, a write path can also be monitored. The write path can include the address lines and/or signal lines (e.g., data lines) that provide input data to the memory 213.

The monitor 213 can determine whether there are any errors in the output data while the device 224 is idle. The monitor 213 can report the errors. For example, the monitor 213 can identify errors in the output data as errors corresponding to the memory read data timing and can determine if there are any inconsistencies with the memory read data timing. As used herein, memory read data path timing describes a timing associated with reading data from the device 224. The memory read data timing can be a duration of time that it takes for a signal to arrive at the device 224 via an input line, a duration of time the device 224 takes to output data, and/or a duration of time the output data travels through an output line.

The monitor 213 monitors a real read path timing regardless of whether the device 224 is being actively read or not. For example, the monitor 213 can monitor the read path timing if the device 224 is intended to be idle. The device 224 can be intended to be idle if the ME signal 226 has a 0-value. The monitor 213 can continue to monitor the read path timing even if the system 221 does not receive a read command from the host. The real read path timing can be referred to as real because the read path monitored is the actual read path utilized to read data from the device 224. The monitor 213 monitor can monitor a real read path timing by determining if there are errors in the data read from device 224.

The monitor 213 can monitor the read path timing if the system 221 is idle (e.g., ME signal 226 is low) by creating commands and/or selecting addresses associated with the commands. The commands created by the monitor 213 can be referred to as monitored commands. For example, a read command generated by the monitor 213 can be referred to as a monitored read command. The system 221 can be referred to as idle if the system 221 is not actively processing host read commands and/or host write commands. For example, the system 221 can be referred to as "idle" if the system 221 is not actively processing host read commands and/or host write commands. The monitor 213 can provide an address to the device 224. In various examples, the device 224 can be considered idle if the ME signal 226 is low regardless of if the device 224 is being read by the monitor 213.

The address provided by the monitor 213 to the device 224 can include one of two or more addresses. The two or more addresses can be toggled. As used herein, 'toggling' can include continuously switching between the multiple options. The two or more addresses can be toggled by switching between the two or more addresses and providing the selected address to the device 224. As used herein, continuously performing an action describes the repeated performance of the action over a period of time. Periodically performing an action describes the alternating between repeatedly performing the action and not performing the action. Continuously monitoring for errors has the advantage of identifying errors as soon as they occur. Continuously monitoring for errors has the disadvantage of utilizing more energy as compared to not monitoring for the errors. In various instances, the continuous nature of the monitoring can be dependent on the type of error being monitored for and/or the type of device/read path being monitored. For instance, the device can be monitored in long continuous intervals if the device is a mobile device to preserver power as opposed to monitoring in short continuous intervals if the device is not a mobile device.

The device 224 can generate read data (e.g., output data) and can provide the read data through input/output (I/O) lines if the read data is functional data. The device 224 can provide the read data to the checking circuitry 234 regardless of if the read data is functional data or if the output data was read using the monitored addresses provided to the device 224. As used herein, the checking circuitry 234 can include hardware for detecting errors in data read from the device 224. The checking circuitry 234 can be parity error checking circuitry or different circuitry for identifying errors. The monitor 213 can delay the read data along the read path. The monitor 213 can utilize Read Margin (RM) pins and/or additional delay lines to delay the read data. For example, the monitor 213 can delay the read data along the read path if the read data is being monitored. The read data can be delayed to trigger an error earlier, before it actually occurs. The early error indication can be utilized if a voltage and/or frequency can be adjusted before the real error occurs.

Delaying the read data can result in tighter data timing than non-delayed data. The tighter data timing may create a timing violation. For example, the tighter data timing may create a like-setup violation. The timing violation is likely to produce an error at the sampling/checking circuitry 234. The timing violation is likely to produce an error based on a statistical probability.

By introducing an additional delay to the data, the probability of identifying an error at the checking circuitry 234 increases (e.g., may increase substantially). The probability of identifying an error increases when the read data path only approaches its real functional critical timing.

The probability of identifying an error can also increase by setting a checking circuitry sampling clock earlier. Setting a checking circuitry sampling clock earlier can result in a tighter timing. A tighter timing can cause timing errors before they actually happen at the functional data path. However, manipulating the clock when the monitor is active and returning the clock to its previous timing when the functional path is active may present more challenges than adding extra delay to the data path.

The monitor 213 can monitor the read path for timing compliance utilizing the checking circuitry 234. The read path can be monitored for a SoC error. In contrast to a standard (STD) logic path, a read path includes both a memory access time and a logic propagation time. An STD logic path can include a logic propagation time. The memory access time can include a duration of time in which the device 224 accesses data responsive to receipt of a command. The logic propagation time include a duration of time utilized to propagate a signal through lines and/or logic circuitry. It may be difficult to choose just a few representative bits from the memory data to check the timing for an entire bus. Although the device 224 utilizes I/O lines, other devices may utilize buses, interfaces, and/or fabrics to receive and convey data. Although the examples provided herein are given in terms of timing, the examples can be implemented to identify a number of different types of errors using the output data.

The monitor 213 can monitor the read path utilizing the checking circuitry 234. The monitor 213 can monitor for and identify potential errors in the output data. The errors identified by the checking circuitry 234 can be attributed to timing violations if timing violations are monitored or a different type of violation if the different type of violation is being monitored for. The monitor 213 can indicate potential errors utilizing the reporting circuitry 237. The checking circuitry 234 can be error correction code (ECC) circuitry, for example. The monitor 213 can reuse existing ECC circuitry as an end point monitor circuitry. Although the examples described herein are given in the context of timing compliance, the examples can be extended to monitoring for aging, monitoring for voltage drops, monitoring for clock frequency swings, and/or monitor for signal integrity, among other timing related issues.

The monitor 213 can trigger alerts such as functional safety (FUSA) alerts responsive to identifying timing violations and/or other types of violations. For example, the monitor 213 can alert to voltage or circuitry failures and/or security threats such as thermal and power supply attacks. The monitor 213 can also alert to physical tampering among other types of violations. As used herein, thermal and power supply attacks can include attacks which exploit thermal properties and/or power supplies to obtain data from a device such as the system 221. In various examples, the monitor 213 can be utilized to control the voltage and/or frequency in dynamic voltage and frequency scaling (DVFS) or adaptive voltage or frequency scaling (AVFS) systems.

The monitoring function of the monitor 213 can be enabled responsive to the states of the signal 226 (ME). For example, the monitor can be enabled when the memory device is in an idle state in which the ME signals is low (e.g., "0") such that the device 224 is not actively performing a host write or host read operation. When the ME signal is low, the NOT gate 227 outputs a logic "1," which can enable the clock gate 228, which provides a clocking signal to the sequential elements 229-1 and 229-2.

The clock gate 228 can receive timing signals from a clock line (CLK). The timing signals provided by the clock line can include clock signals.

The output of clock gate 228 can be used to clock the sequential elements 229-1, 229-2. The clock line can provide a clock signal. The sequential elements 229-1, 229-2 can include circuitry configured to provide a delay and/or switch between states. For example, the sequential element 229-1 can switch between states based on the clock signal provided by the clock gate 228. The output of the sequential element 229-1 can be used to select between two or more addresses using the MUX 230-1 by toggling between the two or more addresses. The two or more toggled addresses (e.g., address X and address Y) can exercise the memory read data path. Exercising the memory read data path can include using the memory read data path or causing the memory read data path to be utilized.

As shown in FIG. 2, an output of the sequential element 229-1 can be used to select (e.g., toggle between) one of multiple addresses including the address 231-1 ("X") and the address 231-2 ("Y"). The addresses 231-1, 231-2 can be provided by the monitor 213. For instance, the addresses 231-1, 231-2 can be read addresses provided by the monitor 213. The addresses 231-1, 231-2 can point to specific memory cells of the device 224 that store predefined bit-value patterns. The bit-value patterns can be different. The bit-value patterns can allow the checking circuitry 234 to determine whether the bit-value patterns were read with an error. A timing of the read path can be ascertained based on the change of the bit-value patterns or based on errors of the output data. Although two different bit-patterns are contemplated herein, various examples can be applied to three or more bit patterns. The device 224 can be programmed to store the two or more bit patterns in memory cells having the addresses 231-1, 231-2. The memory cells having the addresses 231-1, 231-2 can be accessed by the monitor 213 but may not be accessible externally from the system 221.

The output Q bar of the sequential element 229-1 is coupled to its input D such that the output of the sequential element 229-1 toggles between high and low values with each clock pulse. The sequential element 229-1 can provide a first value at a first time and a second value at a second time. The first value can cause the MUX 230-1 to output the address 231-1 while the second value can cause the MUX 230-1 to output the address 231-2. The sequential element 229-1 toggles between addresses being monitored at each clock cycle when the monitor 213 is enabled. The sequential element 229-2 toggles between high and low values based on whether monitor 213 is enabled or not (e.g., outputs "1" when idle and "0" when enabled). The output of the sequential element 229-2 can be used to output the data as functional data to I/O lines or prevent the output of the data to the I/O lines.

The output of the MUX 230-1 can be provided as an input to the MUX 230-2. The MUX 230-2 can also receive the functional address 231-2 as an input. The MUX 230-2 can be used to select one of the addresses 231-1, 231-2 or the functional addresses 231-3 based on whether the device 224 is idle or is not idle. For instance, if the device 224 is idle, then the MUX 230-2 can select one of the addresses 231-1, 231-2 as provided by the MUX 230-1. If the device 224 is not idle, then the MUX 230-2 can provide the functional address 231-3.

The device 224 can receive a monitored address. The ME pin 238 of device 224 can be provided continuously with a high signal (e.g., 1) such that the device 224 is enabled (e.g., read/write enabled) and can be read from regardless of the state of the ME signal 226. For example, if the ME signal 226 is low such that the device 224 is not processing host read/write commands, the device 224 can still process read commands in association with monitoring operations as described herein. The device 224 can output a data pattern if the device 224 received a monitored address. The output data can be provided to the checking circuitry 234. The functional data 233 can be provided by the device 224 if the functional address 231-3 was provided to the device 224. The gate 232 can be used to filter out the data patterns, also referred to as monitored data, from the functional data 233. For example, the gate 232 can provide the functional data 233 via the remainder of the I/O lines but may not provide the monitored data via the remainder of the I/O lines based on the input received from the sequential element 229-2. The gate 232 can be an AND gate, a gate latch, and/or flip flops, among other circuitry that can be used to filter out the data patterns. For example, the gate 232 can be implemented as flip flops that drive old values as the functional data 233 while the device 224 outputs toggled monitored data. Retaining the last functional read data using the gate 232 (e.g., by driving the functional read data) can save power and does not introduce limitations to the logic at the functional data path.

The monitored data can be delayed in being provided to the checking circuitry 234. The checking circuitry 234 can determine whether there are errors (e.g., parity errors) in the output from the device 221 if the functional data is read or if the monitored data is read. The errors identified by the checking circuitry 234 can be attributed to a number of types of errors such as a timing error.

The output of the checking circuitry 234 can be provided to the AND gate 235. The AND gate 235 can also receive an output of the sequential element 229-2. The AND gate can provide an indication of a functional error for the functional data 233 if the checking circuitry 234 identifies an error for the functional data 233 and if the sequential element 229-2 provides the appropriate timing signal. The checking circuitry 234 can provide an output to the reporting circuitry 237. The reporting circuitry 237 can report the error for the functional data and/or an error for the timing of the read path.

The memory read data path can remain toggling continuously if the device 224 is not being written to. For example, the timing of the memory read data path can continuously be evaluated if the device 224 is idle (e.g., ME signal 226 is low). Although not discussed in detail, the monitor 213 can also monitor the timing of the memory data path in write cycles. For example, a device can receive separate read addresses and write addresses. The monitor 213 can provide separate read addresses and write addresses to the device. The monitor 213 can monitor the device to determine the timing of the device data path when the device received read addresses and when the device received write addresses. A device that receives separate read addresses and write addresses can be a dual port device, for example. The device can be a single port or a dual port device. The device can be any addressable device such as a network-on-chip (NoC) port, and/or a fabric interconnect device, among other addressable devices.

In various instances, the sequential elements 229-1, 229-2 can be programmable. The sequential elements 229-1, 229-2 can be programmed based on the latency of the memory read data path and/or the latency of device 224. For instance, if a different device is utilized instead of the device 224, then the sequential elements 229-1, 229-2 can be programmed based on the latency of the different device.

Figure 3:
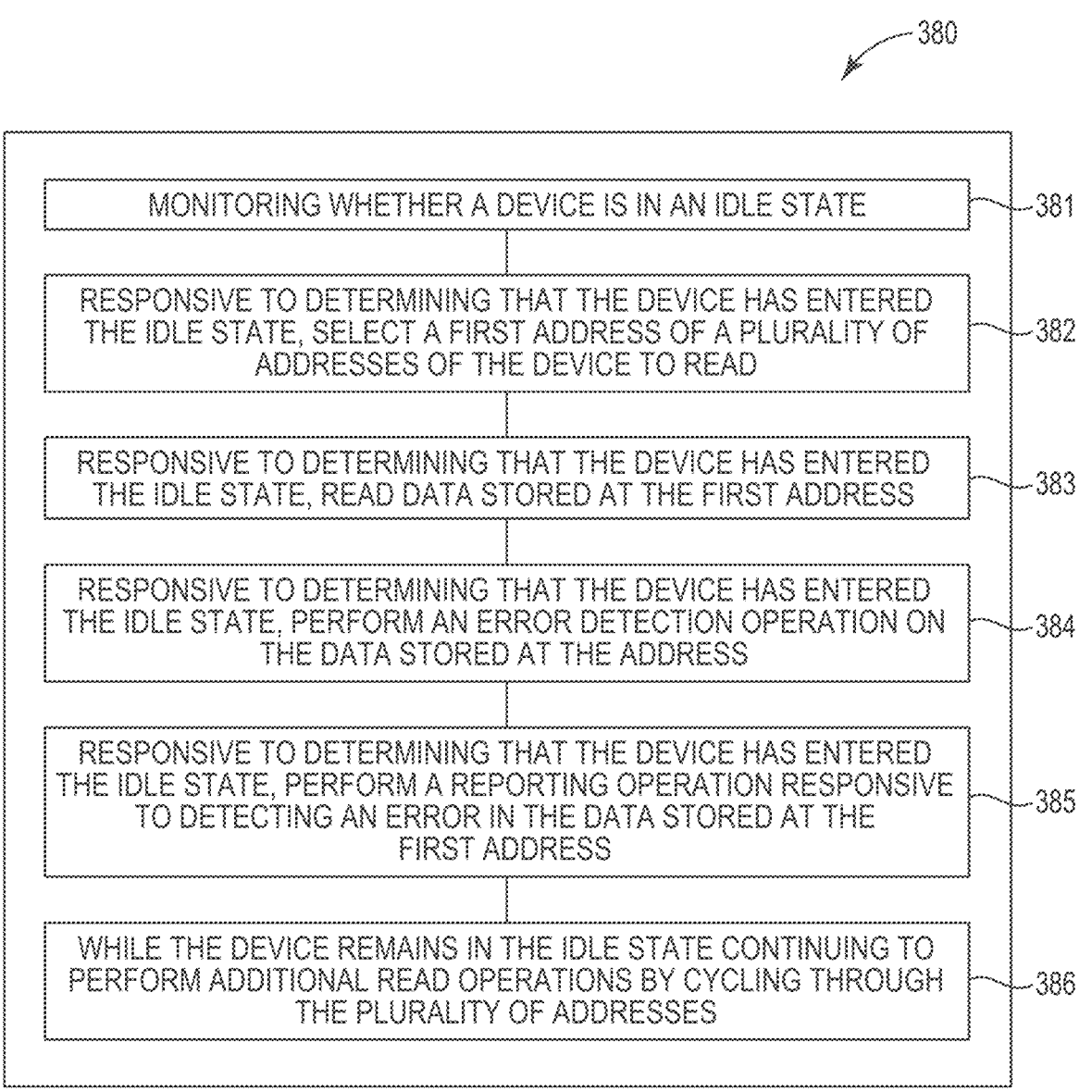
FIG. 3 is a flow diagram corresponding to a method for monitoring a device data path in accordance with some embodiments of the present disclosure.

FIG. 3 is a flow diagram corresponding to a method 380 for monitoring a device data path in accordance with some embodiments of the present disclosure. The method 380 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 380 is performed by the processor (e.g., monitor component 113 of FIG. 1). Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

The processor can be any type of hardware, firmware, or software for performing the function of the monitor component 113 of FIG. 1. For example, the processor can be a monitor. The method 380 includes monitoring a device data path. A processor can be coupled to a device. The device can be an addressable device. At 381, the processor can continuously monitor whether a device is in an idle state. The device can be inactive (e.g., idle) when the ME signal 226 is low such that device 224 is not actively processing host read and/or write commands. Although the processor is described as continuously monitoring a device, the processor can also periodically monitor the device. For example, continuously monitoring a device may consume more resources than are necessary for the implementation. If a device is implemented in a mobile device that has limited power resources, the device may be monitored periodically. The device may also be monitored periodically if the monitoring of the device continuously negatively contributes to the safety and/or security of the device.

At 382, responsive to determining that the device has entered the idle state, the processor can select a first address of a plurality of addresses of the memory to read. At 383, responsive to determining that the device has entered the idle state, the processor can read data stored at the first address. At 384, responsive to determining that the device has entered the idle state, the processor can perform an error detection operation on the data stored at the address. At 385, responsive to determining that the device has entered the idle state, the processor can perform a reporting operation responsive to detecting an error in the data stored at the first address. At 386, while the device remains in the idle state, the processor can continue to perform additional read operations by cycling through the plurality of addresses.

The processor can monitor the output data by intercepting the output data. The error associated with the device can be a timing error of a data path for the device. The command can be provided to the device along the data path. The output data can be provided by the device along the path. The processor can continuously or periodically create and provide the command to the device. Continuously creating and providing the command to the device allows the data path to be continuously monitored for timing issues. Periodically monitoring the device allows the data path to be continuously monitored for periods of time and not monitored for other periods of time.

In various instances, the device can be an addressable device such as a memory device, although other types of devices can be implemented. The processor can provide the address to the device. The address can correspond to the command generated by the processor. The processor can provide the address and an ME signal to the device.

The processor can provide the output data to an error detecting circuitry such as a checking circuitry. The processor can reutilize the checking circuitry to identify an error associated with the device and/or the timing of the data path of the device. The checking circuitry can be a parity error system that is utilized by a memory system to perform ECC, for example. The processor can also use the already existing parity error system to identify errors associated with the device and/or the timing of the data path of the device. Although the examples described herein can utilize a parity error checking circuitry to identify errors, other types of circuitry can be utilized to identify errors.

The processor can delay the providing of the output data to the checking circuitry. For example, the processor can delay output data from being provided to the checking circuitry utilizing one or more delay elements. The one or more delay elements can be configured based on the delay of the device and/or the data path. The one or more delay elements can be configured based on the type of error being monitored for.

The processor can provide the address to the device by providing one of a first address or a second address to the device. The processor can select one of the first address or the second address. The selected address can be provided to the device. The processor can continuously select one of the first address or the second address. The processor can select an address at predefined intervals of time. The processor can provide the address at the same predefined intervals of times. The intervals of time can be defined using a clock signal, for example.

The processor can toggle between the first address and the second address based on time to select the address. The processor can alternate the selection of the first address and the second address. For example, the processor can select the first address at a first time, the second address at a second time, the first address at a third time, a fourth address at a fourth time, etc. The toggling between the first address and the second address can be defined using a clock signal. The clock signal can be for the SoC or for the device.

The processor can provide a functional address to the device responsive to determining that the device is active. For instance, if the device is active, then the processor can provide the functional address to the device instead of providing the monitored address to the device.

In various examples, a processor (e.g., the monitor) can determine whether a device is in an idle state. For example, the processor can continuously monitor a memory enable signal (e.g., ME signal 226) to determine whether the memory is inactive. The processor can continuously determine whether the device is active without reference to a clock signal. For instance, the processor can continuously determine whether the device is idle to enable a clock signal. Enabling the clock signal can include utilizing the clock signal to toggle between the monitored addresses. Although an ME signal is used in the examples provided herein to determine whether a device is idle, other signals and/or means can be used to determine whether a device is idle. The use of an ME signal to determine whether a device is idle is illustrative and not limiting.

Responsive to determining that the device is idle, the processor can provide one of a plurality of read addresses at different times to the device. For example, the processor can cycle through providing different ones of the plurality of read addresses to the device.

The processor can wait a predetermined duration of time. The processor can utilize a sequential element to wait the predetermined duration of time.

Responsive to waiting the predetermined duration of time and responsive to providing the one of the plurality of read addresses, the monitor can capture output data from the device. The processor can intercept the output data as it travels along the data path. For example, the processor can route the output data to a checking circuitry. The processor can determine whether the output data incudes errors to determine whether the device has been compromised.

The processor configured to provide one of the plurality of read addresses can generate a read command and can provide the read command to the device. In various examples, the processor may be able to monitor write commands.

The plurality of addresses can include a first read address and a second read address. The processor can provide one of the first read address or the second read address to the device. Responsive to determining that the device is idle, the processor can continuously or periodically provide the first address or the second address to the device. The processor can continuously provide the first address or the second address by alternating between the first address and the second address based on a clock signal. The errors can include timing errors, security errors, and/or safety errors. The timing errors can be identified to update a configuration of the device to align the data path's time with expectations. The security errors can be monitored to determine whether there are security threats to the device. For example, a host can be informed of the security errors to allow the security errors to be corrected and/or addressed. The safety errors can be utilized to ensure the safety of a system and/or to address the safety concerns of the system. Timing and/or power errors can be utilized to control DVFS and/or AVFS enabled systems. The errors can also include power errors, noise errors, temperature errors, signal integrity errors, radiation-induced errors, electromagnetic errors, and/or mechanical errors, among others.

In various instances, an apparatus can include a memory and a processor coupled to the memory. The processor can determine whether the device is inactive utilizing a NOT gate. The NOT gate can receive the ME signal and can invert the ME signal. The output of inverting the ME signal can indicate whether the read path is being monitored based on the status of the ME signal.

Responsive to determining that the device is inactive, the processor can continuously or periodically provide a first address or a second address to the command utilizing a plurality of MUX to the data. For instance, a first MUX can be utilized to select one of the first address and the second address. A second MUX can select one of a functional address and the selected address output by the first MUX.

In various instances, the output data can be monitored utilizing a checking circuitry. The output data generated by the device can be monitored responsive to receipt of the first address or the second address to determine whether there is an error associated with the device. Utilizing the checking circuitry to perform ECC and to determine whether there is an error associated with the data path of the device can allow for the implementation of the processor without having to implement new circuitry to monitor the output data.

The processor can perform an action responsive to determining that there is an error associated with the data path of the device. For instance, the processor can report the error associated with the data path of the device.

The processor can include a plurality of MUXs including a first MUX configured to provide the first address or the second address. The first MUX can receive the first address and the second address. The MUX can receive a control signal to indicate which of the first address and the second address to output.

The plurality of MUXs can also include a second MUX. The second MUX can provide one of the first address or the second address, or a functional address to the device. For example, after the first MUX selects one of the first address or the second address, the second MUX can elect one of the selected address provided by the first MUX and the functional address.

The output of the first MUX and the functional address can be provided to the second MUX. The second MUX can provide the output of the first MUX or the functional address based on whether the device is idle. If the device is idle, then the second MUX can provide the output of the first MUX. If the device is active, then the second MUX can provide the functional address to the device.

The processor can comprise toggling circuitry to continuously toggle between the first address and the second address. The toggling circuitry can include a sequential element configured to provide alternating signals to the plurality of MUX and the plurality of MUX to provide an address to the device. The toggling circuitry can receive a clock signal and can utilize the clock signal to change states and provide an output to the MUXs. The output provided to the MUX can be based on a state of the sequential element. The sequential element can change between two or more states. The quantity of states of the sequential element can be equal to the quantity of monitored addresses. If the five monitored addresses are toggled, then the sequential element can have five different states. Each of the states of the sequential element can correspond to a different one of the monitored addresses. The device can store different data patterns in memory cells having the different monitored addresses.

Figure 4:
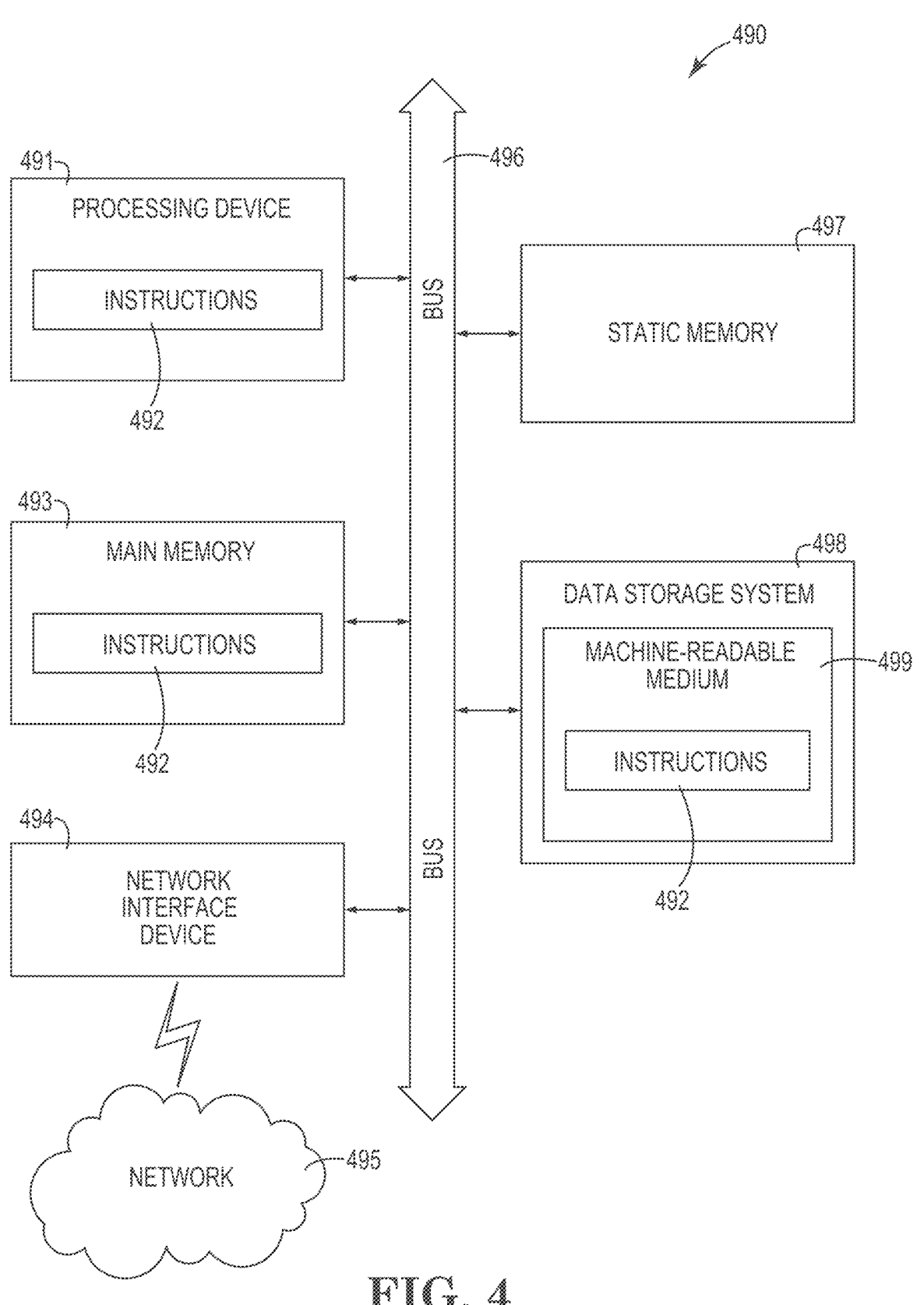
FIG. 4 is a block diagram of an example computer system in which embodiments of the present disclosure may operate.

FIG. 4 is a block diagram of an example computer system in which embodiments of the present disclosure may operate. For example, FIG. 4 illustrates an example machine of a computer system 490 within which a set of instructions, for causing the machine to perform any one or more of the methodologies discussed herein, can be executed. In some embodiments, the computer system 490 can correspond to a host system (e.g., the host system 102 of FIG. 1) that includes, is coupled to, or utilizes a memory system (e.g., the system 221 of FIG. 2) or can be used to perform the operations of a controller (e.g., to execute an operating system to perform operations corresponding to the monitor component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 490 includes a processing device 491, a main memory 493 (e.g., read-only memory (ROM), flash memory, dynamic random access memory (DRAM) such as synchronous DRAM (SDRAM) or Rambus DRAM (RDRAM), etc.), a static memory 497 (e.g., flash memory, static random access memory (SRAM), etc.), and a data storage system 498, which communicate with each other via a bus 496.

The processing device 491 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 491 can also be one or more special-purpose processing devices such as an application specific integrated circuit (ASIC), a field programmable gate array (FPGA), a digital signal processor (DSP), network processor, or the like. The processing device 491 is configured to execute instructions 492 for performing the operations and steps discussed herein. The computer system 490 can further include a network interface device 494 to communicate over the network 495.

The data storage system 498 can include a machine-readable storage medium 499 (also known as a computer-readable medium) on which is stored one or more sets of instructions 492 or software embodying any one or more of the methodologies or functions described herein. The instructions 492 can also reside, completely or at least partially, within the main memory 493 and/or within the processing device 491 during execution thereof by the computer system 490, the main memory 493 and the processing device 491 also constituting machine-readable storage media. The machine-readable storage medium 499, data storage system 498, and/or main memory 493 can correspond to the system 221 of FIG. 2.

In one embodiment, the instructions 492 include instructions to implement functionality corresponding to syndrome calculation circuitry (e.g., the monitor component 113 of FIG. 1). While the machine-readable storage medium 499 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. An apparatus, comprising:
   a device;
   a processor coupled to the device and configured to:
      determine whether the device is in an inactive state;
      responsive to determining that the device is in the inactive state, alternate access of a number of addresses of the device by toggling between the number of addresses based on a clock signal, wherein memory cells of the device having the number of addresses store output data comprising predefined bit-value patterns;
      monitor the output data, to monitor a read path of the device, generated by the device responsive to the number of addresses to determine whether accessing one or more of the number of addresses results in an error in the output data,
         wherein the output data is provided by the device along a data path, and
         wherein the output data is continuously monitored when the device is in the inactive state; and
      perform an action responsive to determining that there is an error in the read path of the device based on the error in the output data.

2. The apparatus of claim 1, wherein the device is an addressable device.

3. The apparatus of claim 2, wherein the processor is further configured to provide an address to the addressable device.

4. The apparatus of claim 3, wherein the processor is configured to provide the output data to a checking circuitry.

5. The apparatus of claim 4, wherein the processor is configured to provide the output data to the checking circuitry via input/output (I/O) lines.

6. The apparatus of claim 3, wherein the processor configured to provide the address is further configured to provide one of a first address or a second address to the addressable device.

7. The apparatus of claim 6, wherein the processor is further configured to toggle between the first address or the second address, based on time, to select the address.

8. The apparatus of claim 1, wherein the processor is further configured to provide a functional address to the device responsive to determining that the device is active.

9. A method, comprising:
   monitoring whether a device is in an idle state based on a memory enable (ME) signal, wherein the ME signal having a first state corresponds to the device being in the idle state in which the device is not actively processing host read commands, and the ME signal having a second state corresponds to the device being in a non-idle state in which the device is configured to actively process host read commands;
   responsive to the ME signal having the second state, read, from the device, data stored at a functional address corresponding to a received host read command;
   responsive to the ME signal having the first state corresponding to the device being in the idle state, perform a read path monitor operation that includes:
      selecting a first monitored address of a plurality of monitored addresses of the device to read;

reading monitored data stored at the first monitored address;

performing an error detection operation on the monitored data stored at the first monitored address to determine whether the monitored data has an error;

performing a reporting operation to report an error in a read path of the device responsive to detecting the error in the monitored data stored at the first monitored address; and while the device remains in the idle state:

continuing to perform additional read operations by cycling through the plurality of monitored addresses.

10. The method of claim 9, wherein the idle state is a state in which the device receives the ME signal having the first state.

11. The method of claim 9, wherein the plurality of monitored addresses includes the first read address and a second read address, and further comprising providing one of the first read address or the second read address to the device.

12. The method of claim 11, wherein responsive to determining that the device is not write enabled or read enabled, providing the first address or the second address to the device repetitively over a period of time.

13. The method of claim 9, wherein the error is caused by timing errors.

14. The method of claim 9, wherein the error includes security errors.

15. The method of claim 9, wherein the error includes safety errors describing a safety of a system that includes the device.

16. An apparatus, comprising:

a device;

a processor coupled to the device and configured to:

determine whether the device is inactive based on a memory enable (ME) signal, wherein the ME signal having a first state corresponds to the device being in the idle state in which the device is not actively processing host read commands, and the ME signal having a second state corresponds to the device being in a non-idle state in which the device is configured to actively process host read commands;

responsive to the ME signal having the second state, read, from the device, data stored at a functional address corresponding to a received host read command;

responsive to the ME signal having the first state corresponding to the device being in the idle state, perform a read path monitor operation that includes:

alternate providing a first address and a second address of a command utilizing a plurality of multiplexors (MUX), repetitively over a period of time and wherein memory cells of the device having the first address and the second address store monitored data comprising predefined bit-value patterns;

monitor the monitored data from the device generated responsive to receipt of the first address or the second address to determine whether there is an error associated with a data path of the device, wherein the monitored data comprises predefined bit-value patterns; and perform an action responsive to determining that there is an error associated with the data path of the device.

17. The apparatus of claim 16, wherein the processor comprises the plurality of MUXs including a first MUX configured to provide the first address or the second address.

18. The apparatus of claim 17, wherein the plurality of MUXs includes a second MUX configured to provide one of the first address or the second address or the functional address to the device.

19. The apparatus of claim 18, wherein an output of the first MUX and the functional address are provided to the second MUX and wherein the second MUX provides the output of the first MUX or the functional address based on whether the device is idle.

20. The apparatus of claim 16, wherein the processor further comprises toggling circuitry to toggle between the first address and the second address repetitively over the period of time.

* * * * *